Figure 1:
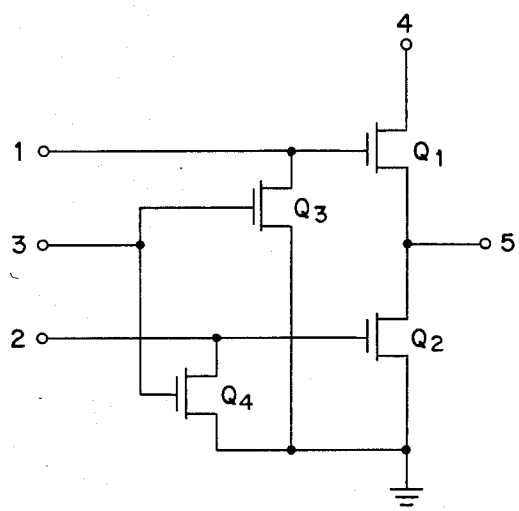

United States Patent [19]

Ando

[11] Patent Number: 4,717,846
[45] Date of Patent: Jan. 5, 1988

[54] TRI-STATE OUTPUT CIRCUIT PROVIDED WITH MEANS FOR PROTECTING AGAINST ABNORMAL VOLTAGE APPLIED TO OUTPUT TERMINAL

[75] Inventor: Manabu Ando, Tokyo, Japan

[73] Assignee: Nippon Electric Co. Ltd., Japan

[21] Appl. No.: 912,197

[22] Filed: Sep. 25, 1986

Related U.S. Application Data

[63] Continuation of Ser. No. 700,339, Feb. 12, 1985, abandoned, which is a continuation of Ser. No. 366,778, Apr. 8, 1982, abandoned.

[30] Foreign Application Priority Data

Apr. 8, 1981 [JP] Japan .................. 56-52664

[51] Int. Cl.[4] ............... H03K 19/00; H03K 19/20
[52] U.S. Cl. ............................ 307/473; 307/443;
307/200 B; 307/550; 307/450
[58] Field of Search ............ 307/200 B, 443, 450, 307/473, 550, 562, 475, 448, 481, 446, 568, 585, 575, 574

[56] References Cited

U.S. PATENT DOCUMENTS

| 3,949,242 | 4/1976 | Hirasawa et al. | 307/473 |
|---|---|---|---|
| 4,038,564 | 7/1977 | Hakata | 307/474 |
| 4,096,584 | 6/1978 | Owen, III et al. | 307/264 |
| 4,280,065 | 7/1981 | Minato et al. | 307/473 |
| 4,324,991 | 4/1982 | Tamaki | 307/473 |
| 4,344,002 | 8/1982 | Chao | 307/475 |
| 4,345,172 | 8/1982 | Kobayashi et al. | 307/475 |
| 4,363,978 | 12/1982 | Heimbigner | 307/473 |
| 4,380,709 | 4/1983 | Au | 307/473 |
| 4,449,065 | 5/1984 | Davies, Jr. | 307/473 |
| 4,463,273 | 7/1984 | Dingwall | 307/450 |
| 4,488,067 | 12/1984 | Kraft et al. | 307/473 |

FOREIGN PATENT DOCUMENTS

| 5515656 | 9/1981 | Japan | 307/475 |
|---|---|---|---|
| 5576378 | 8/1982 | Japan | 307/475 |

OTHER PUBLICATIONS

Griffin et al., "Low Power Tri-State Driver Circuit", IBM Tech. Disclosure Bulletin, vol. 24, No. 5, Oct. 81 pp. 2445-2557.

Primary Examiner—Stanley D. Miller
Assistant Examiner—Timothy P. Callahan
Attorney, Agent, or Firm—Laff, Whitesel, Conte & Saret

[57] ABSTRACT

An output circuit protected by an abnormal voltage supplied at an output terminal is disclosed. The output circuit comprises a first switching circuit includes first and second transistors connected in series for providing an output terminal with a first potential therethrough in response to a first logic state of a logic signal, a second switching circuit for providing the output terminal with a second potential in response to a second logic state of the logic signal, and means for making the first and second transistors non-conducting when the first switching circuit is disenabled.

9 Claims, 5 Drawing Figures

TRI-STATE OUTPUT CIRCUIT PROVIDED WITH MEANS FOR PROTECTING AGAINST ABNORMAL VOLTAGE APPLIED TO OUTPUT TERMINAL

This is a continuation of Ser. No. 700,339, filed Feb. 12, 1985, which in turn, was, a continuation of Ser. No. 366,778, filed Apr. 8, 1982, both of these prior applications now being abandoned.

The present invention relates to an output circuit making use of insulated gate field effect transistors (hereinafter abbreviated as IGFET's), and more particularly to a push-pull type output circuit which can maintain its output terminal at a high impedance state.

A push-pull circuit is constructed such that two switching transistors are connected in series across voltage source terminals and an output terminal is derived from a junction point between these switching transistors. In such a push-pull circuit, the two switching transistors are driven in a complementary manner by signals having opposite phases to each other, and accordingly a DC current does not flow through these two transistors. Therefore, the push-pull circuit is widely used as an output circuit having small power consumption and yet a high driving ability. Among these push-pull circuits is known the so-called Tri-State circuit, in which there is provided circuit means for simultaneously making the two switching transistors non-conducting to allow an output terminal to take a floating state, that is, a high impedance (Hi Z) state by controllably turning OFF the two switching transistors. This output terminal of the Tri-State circuit is used as connected to a bus line to which other output circuits or input circuits are connected. In such a Tri-State circuit, if an abnormal voltage such as, for instance, a negative voltage in the case where N-channel type transistors are used, is applied to the output terminal when the two switching transistors are both made OFF, then the effective source-gate voltages of both the two switching transistors would cause forward-biased state therein. Consequently, the two switching transistors would become both conducting while passing an abnormal current therethrough and into the output terminal. Furthermore impact ionization would be generated in the switching transistors, resulting in induction of an abnormal substrate current, and hence a malfunction of the circuit was caused or breakdown of the transistors was induced.

One object of the present invention is to provide an output circuit circuit which is free from a malfunction under a high impedance state of an output terminal.

Another object of the present invention is to provide an output circuit that is protected against an abnormal voltage at an output terminal.

According to one aspect of the present invention, there is provided an output circuit comprising a first terminal for receiving a first potential, a second terminal for receiving a second potential, an output terminal, a series circuit coupled between the first terminal and the output terminal, the series circuit including a first field effect transistor and a second field effect transistor connected in series, a third field effect transistor coupled between the second terminal and the output terminal, first means responsive to a data signal for controlling the second and third field effect transistors in a complementary manner during an enabled period, means for making the first field effect transistor conducting in the enabled period, and means for making the first field effect transistor non-conducting during a disenabled period.

According to another aspect of the present invention, there is provided an output circuit comprising a first terminal for receiving a first signal, a second terminal for receiving a second signal of an opposite phase to the first signal, an output terminal, a first switching citcuit for operatively supplying the output terminal with a first potential in response to said first signal, and a second switching circuit for operatively supplying said output terminal with a second potential in response to the second signal, the first switching circuit including a first field effect transistor and a second field effect transistor connected in series whose gates are supplied with a signal of the same phase as said first signal.

According to still another aspect of the present invention, there is provided a circuit comprising an input-/output terminal; a bus line; a plurality of output circuits each having an output terminal connected to the input-/output terminal; each of the output circuits including first to third field effect transistors and being responsive to an input data signal to switch its output signal between a first potential and a second potential during an enabled period and taking a high impedance state during a disenabled period, each of the output circuit deriving the first potential through the first and second field effect transistors connected in series thereof while deriving the second potential through the third field effect transistor during the enabled period, both of the first and second field effect transistors being kept non-conducting during the disenabled state.

According to one feature of the present invention, an additional IGFET for control use is connected between a voltage source terminal and one end of the series circuit of a first switching IGFET and a second switching IGFET of a push-pull output circuit. This control IGFET is made to be a conductive state or a low impedance state upon activation of the output circuit but is made to be a non-conductive state or a high impedance state upon inactivation of the output circuit.

According to the present invention, the above-mentioned control IGFET is made non-conductive upon inactivation of the output circuit and accordingly, even if an abnormal voltage should be applied to the output terminal, a current would not be produced or, if produced, would be produced only a little between the output terminal and the voltage source terminal, and therefore, abnormal operation can be suppressed. In this connection, it is favorable that the above-described control IGFET should transmit the potential at the voltage source terminal to the series circuit of transistors without substantially lowering the potential level when it is conducting, and in view of this requirement it is desirable to use a deplation type IGFET as the control IGFET.

According to another feature of the present invention, there is provided an output circuit comprising a first MIS FET having its gate connected to a first input terminal and its source connected to an output terminal, a second MIS FET having its drain connected to the output terminal, its gate connected to a second input terminal adapted to be applied with a signal that is complementary to the signal applied to the first input terminal and its source supplied with a reference potential such as ground potential, a third MIS FET having its drain connected to the first input terminal, its gate connected to a third input terminal adapted to be applied with a signal for maintaining the output terminal at a high impedance state and its source supplied with the reference potential, a fourth MIS FET having its drain connected to the second input terminal, its gate connected to the third input terminal and its source supplied with the reference potential, and a fifth MIS FET having its drain connected to a voltage source, its gate connected to a fourth input terminal adapted to be applied with a signal that takes a low level when the output terminal is maintained at a high impedance state and its source connected to the drain of the first MIS FET.

According to the present invention, owing to the above-featured construction of the output circuit, even if an abnormal voltage such as, for example, a negative voltage in the case of an N-channel circuit construction should be applied to the output terminal when the output terminal is maintained at a high impedance state, impact ionization would not occur in the output MIS FET's in the output circuit.

Figure 2:
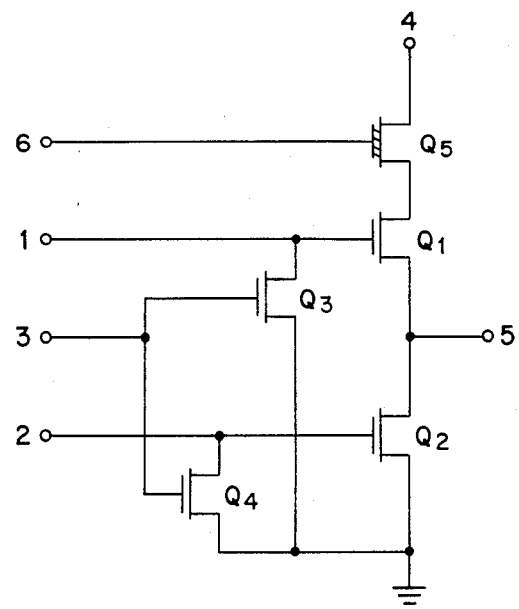
Figure 4:
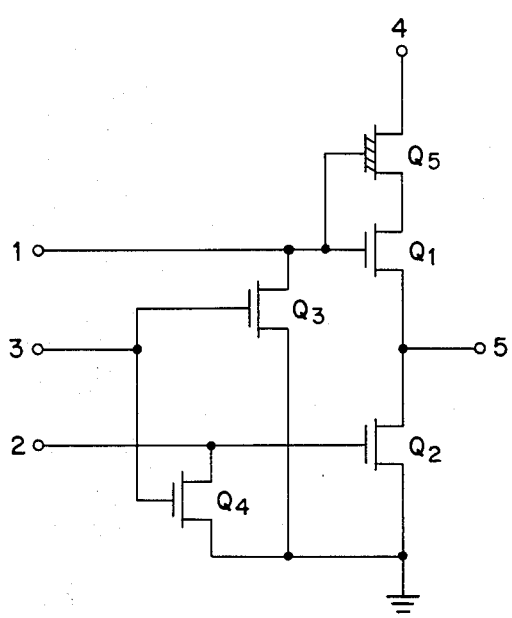
Figure 3:
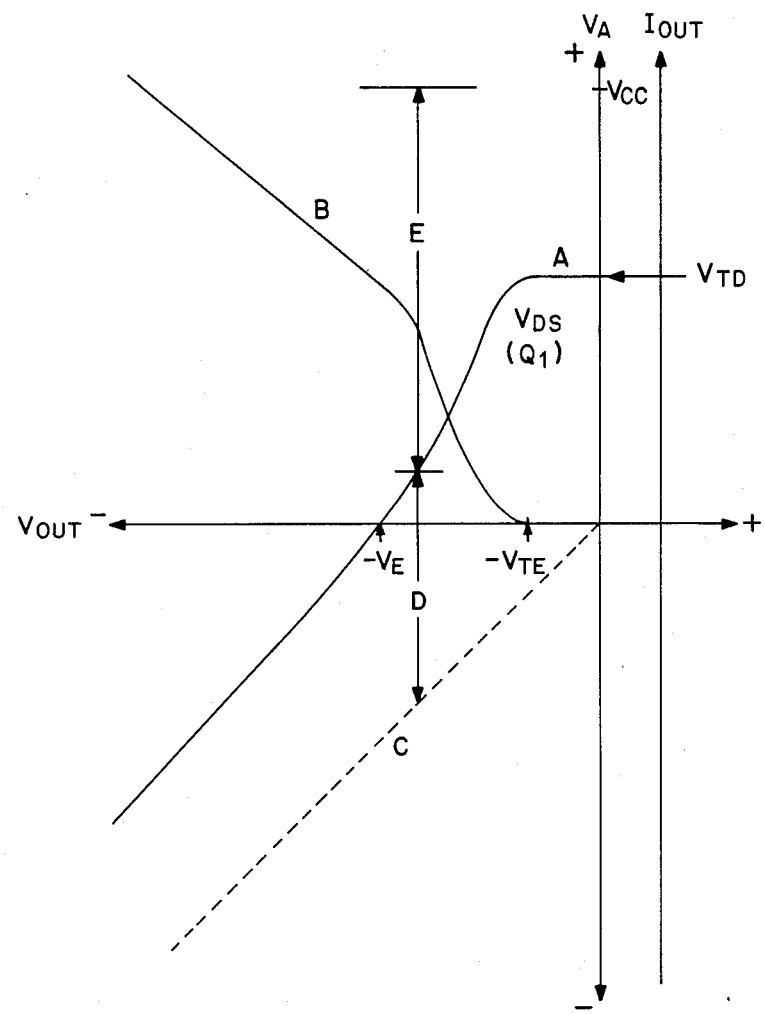
Figure 5:
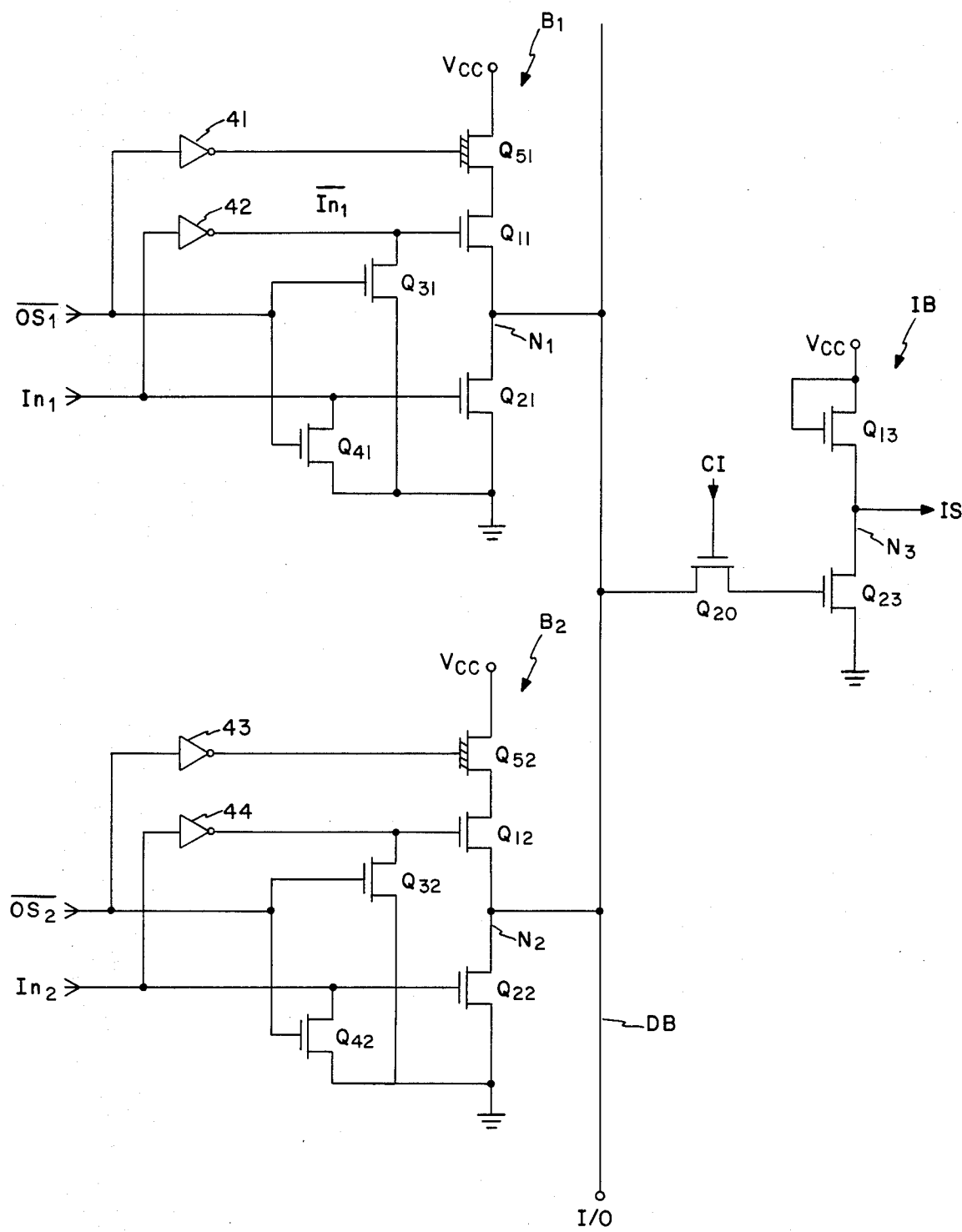

The above-mentioned and other objects, features and advantages of the present invention will become more apparent by reference to the following description of preferred embodiments of the invention taken in conjunction with the accompanying drawings, wherein:

FIG. 1 is a circuit diagram of a push-pull output circuit in the prior art,

FIG. 2 is a circuit diagram of a push-pull output circuit according to a first preferred embodiment of the present invention, FIG. 3 is a diagram showing operation characteristics of the output circuit shown in FIG. 2, FIG. 4 is a circuit diagram of a push-pull output circuit according to a second preferred embodiment of the present invention, and FIG. 5 is a circuit diagram showing one example of application of the output circuits according to the present invention.

As a representative push-pull output circuit employing IG FET's in the prior art, a circuit shown in FIG. 1 has been known. In the following, this heretofore known output circuit will be described assuming, for the sake of simplicity, that N-channel type MIS FET's are employed.

Referring to FIG. 1, a prior art push-pull output circuit comprises a first input terminal 1, a second input terminal 2 adapted to be applied with a signal that is complementary to the signal applied to the first input terminal 1, a third input terminal 3 adapted to be applied with a signal for maintaining an output terminal at a high impedance state, a voltage source terminal 4 adapted to be connected to a voltage source, an output terminal 5, switching IG FET's $Q_1$ and $Q_2$, and IG FET's $Q_3$ and $Q_4$ for maintaining the output terminal 5 at a high impedance state.

Now, operation of the circuit shown in FIG. 1 will be described.

When the third input terminal 3 is at a low level, the IG FET's $Q_3$ and $Q_4$ are held non-conductive, and the first and second input terminals 1 and 2 are supplied with signals which are complementary to each other. Assuming now that the first input terminal 1 is at a high level while the second input terminal 2 is at a low level, the IG FET $Q_1$ is held conducting (ON) while the IG FET $Q_2$ is held non-conducting (OFF), and thus a high level is output at the output terminal 5. On the contrary, if the first input terminal 1 is held at a low level while the second input terminal 2 is held at a high level, then a low level is output at the output terminal 5 through the IG FET $Q_2$. On the other hand, when the third input terminal 3 is at a high level, the IG FET's $Q_3$ and $Q_4$ are held ON, hence the gates of the IG FET's $Q_1$ and $Q_2$ are both held at the ground level, and therefore, the IG FET's $Q_1$ and $Q_2$ are both OFF, resulting in a high impedance state of the output terminal 5. Since both of the IG FET's $Q_1$ and $Q_2$ are OFF, no current flows from the voltage source terminal 4 into the ground, so that substantially no power is consumed in the output circuit, during the high impedance state of the output terminal 5.

Here, let us consider the case where a negative voltage is applied to the output terminal 5 when the output terminal 5 is at a high impedance state an abnormal current flows into the output terminal 5. If the applied negative voltage becomes so low that the potential difference from the ground level exceeds threshold voltages of the IG FET's $Q_1$ and $Q_2$, then the IG FET's $Q_1$ and $Q_2$ are both turned to ON and a current flows therethrough. Accordingly, an abnormal current is made to flow through the output terminal 5, resulting in a malfunction. Moreover, it is to be noted that under the above-mentioned condition, a potential difference larger than the voltage source level is present between the drain and source of the IG FET $Q_1$ and hence the potential difference between the gate and source is smaller than that between the drain and source, so that the IG FET $Q_1$ is operating in a saturated region. It has been known that generally in a IG FET operating in the saturated region, if a potential difference between a drain and a source becomes large, impact ionization would occur by a channel current in a pinch-off region in channel, and hence a substrate current would be greatly increased. Therefore, under the condition that the IG FET's $Q_1$ and $Q_2$ have been turned ON by applying a negative voltage to the output terminal 5 as described above, impact ionization would occur in the IG FET $Q_1$, and hence, the substrate current is greatly increased. As a result, the substrate potential would rise and would adversely affect the operation of the IG FET's.

Recently, in an integrated circuit employing IG FET's, progress is being made in high-density large-scale circuit integration, and channel lengths of IG FET's to be used in such integratd circuits are being more and more shortened. Consequently, the above-mentioned impact ionization phenomena have become more remarkable and their influences have become serious.

Now, a first preferred embodiment of the present invention will be described with reference to FIGS. 2 and 3. In the following description, it is assumed that N-channel MIS FET's are employed and the circuit operates according to positive logic.

Referring to FIG. 2, the output circuit according to the first embodiment comprises a first input terminal 1 adapted to be applied with a first input signal, a second input terminal 2 adapted to be applied with a second input signal that is complementary to the first input signal, a control terminal 3 adapted to be applied with a signal which serves to maintain an output terminal 5 at a high impedance state. A circuit construction relating to output switching MIS FET's $Q_1$ and $Q_2$ and impedance control MIS FET's $Q_3$ and $Q_4$ is identical to that shown in FIG. 1. Besides, according to the present invention, an additional MIS FET $Q_5$ is connected between a voltage source terminal 4 and the drain of the switching MIS FET $Q_1$. A signal that is complementary to the signal applied to the control terminal 3, is applied via another control terminal 6 to the gate of this MIS FET $Q_5$. This MIS FET $Q_5$ is added for the purpose of suppressing the drain-source voltage of the output switching MIS FET $Q_1$ to a low value when the output terminal 5 is maintained at a high impedance state. In the illustrated embodiment, the MIS FET's $Q_1 \sim Q_4$ are enhancement type MIS FET's, while the MIS FET $Q_5$ is a depletion type MIS FET.

Operation of the circuit shown in FIG. 2 will be described hereunder. First, it is assumed that the control terminal 3 is at a low level while the other control terminal 6 is at a high level. At this moment, if the input terminal 1 is at a high level and the input terminal 2 is at a low level, then the output MIS FET $Q_1$ is held ON, while the output MIS FET $Q_2$ is held OFF, so that the high level of the voltage source is output at the output terminal 5. Since the control terminal 6 is at a high level and hence the internal resistance of the MIS FET $Q_5$ is low, the presence of the MIS FET $Q_5$ would little affect the high level at the output terminal 5. If the input terminal 1 is at a low level and the input terminal 2 is at a high level, then the output MIS FET $Q_1$ is held OFF, while the output MIS FET $Q_2$ is held ON, so that a low level is output at the output terminal 5.

Now let us consider the case where the control terminal 3 is at a high level while the other control terminal 6 is at a low level. In this case, since the MIS FET's $Q_3$ and $Q_4$ are held ON, the gates of the output MIS FET's $Q_1$ and $Q_2$ are held at the ground level. Accordingly the output MIS FET's $Q_1$ and $Q_2$ are both held OFF, and the output terminal 5 is maintained at a high impedance state. On the other hand, the control terminal 6 is held at a low level. Since the MIS FET $Q_5$ is of depletion type, the source of the MIS FET $Q_5$ is held at a potential of the value close to the absolute value of the threshold voltage of the MIS FET $Q_5$. When a negative voltage is applied to the output terminal 5 under the aforementioned condition, as the internal resistance of the MIS FET $Q_5$ has a high value, the drain-source voltage of the transistor $Q_1$ is reduced to a low value, and hence impact ionization would not occur. Accordingly, the substrate potential would not rise, and the operation of the device would not be adversely affected thereby.

Now this will be explained in greater detail, with reference to FIG. 3 which illustrates the operation of the circuit of FIG. 2 when a negative voltage has been applied to the output terminal 5 under the above-mentioned condition.

In a diagram shown in FIG. 3, a voltage $V_{OUT}$ applied to the output voltage 5 is taken along the abscissa, while a source voltage $V_A$ of the MIS FET $Q_5$ and a voltage source current $I_{OUT}$ are taken along the ordinate. A curve "A" indicates a relation between the voltage $V_{OUT}$ applied to the output terminal 5 and the source voltage of the MIS FET $Q_5$, the difference between these voltages being equivalent to a drain-source voltage $V_{DS}$ of the MIS FET $Q_1$. In this diagram, a reference character $V_{TD}$ represents a threshold voltage of the MIS FET $Q_5$. Another curve "B" indicates a relation between the voltage $V_{OUT}$ applied to the output terminal 5 and a current $I_{OUT}$ flowing through the MIS FET $Q_1$, and a straight dash line "C" indicates a relation between the voltage $V_{OUT}$ at the output terminal 5 and the source voltage of the output MIS FET $Q_1$ (the straight line being at an angle of 45° with respect to each coordinate axis because these two voltages are quite identical). Accordingly, the distance between the curve "A" and the straight dash line "C" as denoted by a character "D" in FIG. 3 corresponds to the drain-source potential difference of the output MIS FET $Q_1$, and the distance between the voltage source level $V_{CC}$ and the curve "A" as denoted by a character "E" corresponds to the drain-source potential difference of the MIS FET $Q_5$. If the voltage $V_{OUT}$ at the output terminal 5 is increased in magnitude from zero volt in the negative direction, when the absolute value of the applied negative voltage $V_{OUT}$ exceeds the threshold voltage $V_{TE}$ of the output MIS FET $Q_1$, the voltage source current $I_{OUT}$ begins to flow as indicated by the curve "B", and so, the source voltage of the MIS FET $Q_5$ begins to fall as indicated by the curve "A". As the applied negative voltage $V_{OUT}$ increases in magnitude, the voltage source current $I_{OUT}$ increases in a corresponding manner, and the source voltage of the MIS FET $Q_5$ is lowered. What is important in this diagram is that the distance "D" between the curve "A" and the straight dash line "C" which indicates the drain-source potential difference of the output MIS FET $Q_1$, does not increase larger than the potential difference when the voltage $V_{OUT}$ at the output terminal 5 is zero even when the output terminal voltage is made negative, and that the distance E between the voltage source potential $V_{CC}$ and the curve "A" which indicates the drain-source potential difference of the MIS FET $Q_5$, has a smaller value than the voltage source potential $V_{CC}$ until the voltage $V_{OUT}$ applied to the output terminal 5 reaches a value $-V_E$ indicated in FIG. 3. As described previously, impact ionization would occur when a drain-source voltage of a MIS FET operating in a saturated region is high. Accordingly, by lowering a drain-source voltage of one MIS FET by employing the circuit shown in FIG. 2, occurrence of impact ionization in the MIS FET's in the output circuit can be prohibited.

Now, a second preferred embodiment of the present invention will be described with reference to FIG. 4.

Referring to FIG. 4, the second embodiment comprises a first input terminal 1, a second input terminal 2 adapted to be applied with a signal that is complementary to the signal applied to the first input terminal 1, a third input terminal 3 adapted to be applied with a signal for maintaining an output terminal 5 at a high impedance state, a voltage source terminal 4 adapted to be connected to a voltage source ($V_{CC}$), an output terminal 5, output MIS FET's $Q_1$ and $Q_2$, MIS FET's $Q_3$ and $Q_4$ for maintaining the output terminal 5 at a high impedance state, and a MIS FET $Q_5$ for suppressing the drain-source voltage of the output MIS FET $Q_1$ to a low value when the output terminal 5 is maintained at a high impedance state. Similarly to the first preferred embodiment of FIG. 2, the MIS FET's $Q_1$ to $Q_4$ are enhancement type MIS FET's, while the MIS FET $Q_5$ is a depletion type MIS FET.

Operation of the circuit shown in FIG. 4 will be described hereunder. First, let us consider the case where the third input terminal 3 is at a low level. Then the MIS FET's $Q_3$ and $Q_4$ are made both OFF, and hence input signals are applied to the gates of the MIS FET's $Q_1$, $Q_2$ and $Q_5$. Assuming now that the first input terminal 1 is at a high level while the second input terminal 2 is at a low level, then the MIS FET's $Q_1$ and $Q_5$ are turned to ON, while the MIS FET $Q_2$ is turned to OFF, so that the output terminal 5 is held at a high level. In this instance, since the gate of the MIS FET $Q_5$ is at a high level and thus the internal resistance of the MIS FET $Q_5$ is low, the high level at the output terminal 5 has a value that is almost not different from the value in the case where the drain of the MIS FET $Q_1$ is directly connected to the voltage source, similarly to the above-described first preferred embodiment. On the contrary, if the input terminal 1 is at a low level and the input terminal 2 is at a high level, then the MIS FET $Q_1$ is turned to OFF while the MIS FET $Q_2$ is turned to ON, so that the output terminal 5 is held at a low level. Next, let us consider the case where the input terminal 3 is at a high level. Then, the MIS FET's $Q_3$ and $Q_4$ are made both ON, and hence the gates of the MIS FET's $Q_1$, $Q_2$ and $Q_5$ are all at a low level. In other words, the state at this moment is exactly the same as the state when the control terminal 3 is at a high level and the other control terminal 4 is at a low level in the above-described first preferred embodiment. Accordingly, the operation of the circuit when a negative voltage is applied to the output terminal 5 is quite similar to that in the above-described first preferred embodiment, and thereby impact ionization in the output MIS FET's can be prevented.

Now, one example of application of the output circuit according to the present invention will be explained with reference to FIG. 5.

FIG. 5 illustrates an example of application of the present invention as applied to a system in which output circuits and an input circuit are connected to a single input/output data bus line.

A data bus DB is connected to a common input/output terminal I/O. To this data bus DB are connected output circuits $B_1$ and $B_2$ via output nodes $N_1$ and $N_2$, respectively, and an input inverter circuit IB via an input transfer gate transistor $Q_{20}$. The output circuits $B_1$ and $B_2$, respectively, have a circuit construction similar to that according to the first preferred embodiment of the present invention as shown in FIG. 2. More particularly, in the output circuit $B_1$, a depletion type MIS FET $Q_{51}$ is connected between a voltage source $V_{CC}$ and a series circuit of switching MIS FET's $Q_{11}$ and $Q_{21}$ of push-pull construction. In this output circuit $B_1$, a signal $I_{n1}$ is applied to the gate of the MIS FET $Q_{21}$, and a signal $I_{n1}$ produced by inverting the signal $I_{n1}$ through an inverter 42 is applied to the gate of the MIS FET $Q_{11}$. MIS FET's $Q_{31}$ and $Q_{41}$ both become conducting when an output selection signal $OS_1$ is at a high level and switch the MIS FET's $Q_{11}$ and $Q_{21}$ both OFF, and thereby the output node $N_1$ is maintained at a high impedance state. When the output selection signal $OS_1$ is at a high level, the gate of the MIS FET $Q_{51}$ is applied with a low level signal through an inverter 41, so that the MIS FET $Q_{51}$ takes a high impedance state. On the other hand, when the output selection signal $OS_1$ is at a low level, the MIS FET $Q_{51}$ takes a low impedance state, and consequently the output circuit $B_1$ is selectively activated. The other output circuit $B_2$ is also similarly constructed to the output circuit $B_1$, and its activation is controlled by an output selection signal $OS_2$.

An input inverter circuit IB is essentially an inverter in which an input signal from the input/output terminal I/O is received by a gate of a MIS FET $Q_{23}$ via a MIS FET $Q_{20}$ when gate receives a gate signal CI produced when the input signal is fed to the input/output terminal I/O. A signal IS derived from an output node $N_3$ of this inverter IB is introduced to an internal circuit. At this moment, both the signals $OS_1$ and $OS_2$ are at a high level, hence the output nodes $N_1$ and $N_2$ of the respective output circuits $B_1$ and $B_2$ are both maintained at a high impedance state, and thereby application of an input signal to the data bus DB is allowed. In one practical example of application, a memory having a gated output construction can be realized by employing output signals of sense amplifiers in a memory as the above-described input signals $I_{n1}$ and $I_{n2}$ and address signals as the aforementioned output selection signals $OS_1$ and $OS_2$. It is the same as the above-described preferred embodiments of the present invention that in the just described application circuit also, even if an abnormal voltage is applied to the output terminal of the output circuit when the output terminal is maintained at a high impedance state, no abnormal current would be produced in the output circuit.

As described in detail above, the present invention can provide an output circuit in which impact ionization would not occur in the output MIS FET's of the output circuit even if a negative voltage should be applied to its output terminal when the output terminal is maintained at a high impedance state.

I claim:

1. An output circuit comprising a first voltage terminal, a second voltage terminal, an output terminal, a first field effect transistor connected between said first voltage terminal and said output terminal, a second field effect transistor connected between said second voltage terminal and said output terminal, means for supplying a first signal to a gate of said first field effect transistor, means for supplying to a gate of said second filed effect transistor a second signal having a phase which is opposite to the phase of said first signal, said first and second field effect transistors being of the same conductivity type, a third field effect transistor connected between the gate of said first field effect transistor and said second voltage terminal, a fourth field effect transistor connected between the gate of said second field effect transistor and said second voltage terminal, said third and fourth field effect transistors being made conductive in response to a control signal supplied to the gates thereof, and making said first and second field effect transistors non-conductive to bring said output terminal into a high impedance state, means coupled between said first voltage terminal and said first field effect transistor for suppressing an increase in drain-source potential different of said first field effect transistor due to an abnormal voltage which is applied to said output terminal when said output terminal is in said high impedance stage and for prohibiting an occurrence of impact ionization in said first field effect transistor to prevent said first field effect transistor from being broken down, said suppressing means including a fifth field effect transistor coupled between said first voltage terminal and said first field effect transistor, and means coupled to a gate of said fifth field effect transistor and responsive to said control signal for holding a voltage of the gate of said fifth field effect transistor at a level which makes said fifth field effect transistor assume a high internal resistance irrespective of a voltage at said output terminal when said third and fourth field effect transistors are made conductive, said fifth field effect transistor assuming a low internal resistance at least when said first transistor is made conductive by said first signal.

2. An output circuit comprising a first terminal supplied with a first potential, a second terminal supplied with a second potential, an output terminal, a third terminal supplied with a data signal, a fourth terminal supplied with a signal which is an inversion of said data signal, a fifth terminal supplied with a control signal, a first transistor connected between said first terminal and said output terminal and having a gate connected to said third terminal, a second transistor connected between said second terminal and said output terminal and having a gate connected to said fourth terminal, a third transistor connected between said second and third terminals and having a gate connected to said fifth terminal, a fourth transistor connected between said second and fourth terminals and having a gate connected to said fifth terminal, a fifth transistor inserted between said first terminal and said first transistor, said first to fifth transistors being of the same conductivity type, said third and fourth transistors being made conductive in response to said control signal to make said first and second transistors non-conductive irrespective of said data signal and said inverted signal, thereby bringing said output terminal into a high impedance state, and an inverter having an input end connected to said fifth terminal and having an output end connected directly to a gate of said fifth transistor, said inverter bringing said fifth transistor into a high internal resistance state, when said third and fourth transistors are made conductive and said output terminal is in said high impedance state, to prevent a voltage between a drain and a source of said first transistor from being increased by an abnormal voltage which is applied to said output terminal.

3. The output circuit as claimed in claim 2, wherein said first to fourth transistors are enhancement type transistors and said fifth transistor is a depletion type transistor.

4. The output circuit as claimed in claim 2, wherein the absolute value of said abnormal voltage is larger than a voltage which is the sum of a threshold voltage of said first transistor and a voltage difference between said first and second terminals.

5. An output circuit comprising a first terminal supplied with a first potential, a second terminal supplied with a second potential, an output terminal, a third terminal supplied with a first signal, a fourth terminal supplied with a second signal having a phase which is opposite to the phase of said first signal, a fifth terminal supplied with a third signal, a first transistor connected between said first terminal and said output terminal and having a gate connected to said third terminal, a second transistor connected between said second terminal and said output terminal and having a gate connected to said fourth terminal, a third transistor connected between said second and third terminals and having a gate connected to said fifth terminal, a fourth transistor connected between said second and fourth terminals and having a gate connected to said fifth terminal, and a fifth transistor coupled between said first terminal and said first transistor and having a gate connected to said third terminal, said first to fifth transistors being of the same conductivity type, said third and fourth transistors clamping the potentials at the gates of said first, second and fifth transistors at the potential of said second terminal in response to said third signal to bring said output terminal into a high impedance state, said fifth transistor taking a high internal resistance when said third and fourth transistors are made conductive to prevent an increase in drain-source potential difference of said first transistor due to an abnormal voltage which is applied to said output terminal when said output terminal is in said high impedance state.

6. The output circuit as claimed in claim 5, wherein said first to fourth transistors are enhancement type transistors and said fifth transistor is depletion type transistor.

7. The output circuit as claimed in claim 5, wherein the value of said abnormal voltage is larger than a voltage which is the sum of a threshold voltage of said first transistor and a voltage between said first and second terminals.

8. A circuit comprising an input/output terminal; a data bus coupled to said input/output terminal; and a plurality of output circuits each having an output terminal connected to said input/output terminal; each of said output circuits including a first transistor connected between said output terminal and a first potential terminal, a second transistor connected between said output terminal and a second potential terminal, said first and second transistors being of the same conductivity type, a first data input terminal connected to a gate of said first transistor and supplied with a data signal, a second data input terminal connected to a gate of said second transistor and supplied with an inverted signal of said data signal, means responsive to a control signal for making said first and second transistors non-conductive irrespective of said data signal to bring said output terminal into a high impedance state, and means coupled between said first potential terminal and said first transistor for preventing increase in drain-source potential difference of said first transistor due to an abnormal voltage which is applied to said output terminal when said output terminal is in said high impedance state, said preventing means including a third transistor coupled between said first potential terminal and said first transistor, and means coupled to a gate of said third transistor and responsive to said control signal for holding the voltage of the gate of said third transistor at a level which makes said third transistor assume a high internal resistance irrespective of a voltage of said output terminal.

9. The output circuit as claimed in claim 1, wherein said first, second, third and fourth field effect transistors are enhancement type transistors and said fifth field effect transistor is a depletion type transistor.

* * * * *